United States Statutory Invention Registration [19]

[11] Reg. Number: H862

Walker, Jr. [43] Published: Dec. 4, 1990

[54] METHOD OF INDICATING THE STATE OF CHANGE OF A BATTERY USING A LIGHT EMITTING DIODE (LED) CLOCK CONNECTED TO THE BATTERY

[75] Inventor: Charles W. Walker, Jr., Neptune, N.J.

[73] Assignee: The United States of America as represented by the Secretary of the Army, Washington, D.C.

[21] Appl. No.: 228,361

[22] Filed: Aug. 2, 1988

[51] Int. Cl.[5] ..... G08B 21/00; H02J 7/04; G01N 27/46

[52] U.S. Cl. ..... 340/636; 320/43; 320/44; 320/48; 324/435; 368/10

[58] Field of Search ..... 324/426, 427, 435; 340/636; 320/43, 44, 48; 368/9, 10

[56] References Cited

U.S. PATENT DOCUMENTS

| | | | |
|---|---|---|---|
| 4,638,237 | 1/1987 | Fernandez | 340/636 |
| 4,678,999 | 7/1987 | Schneider | 340/636 |
| 4,709,202 | 11/1987 | Koenck et al. | 340/636 |
| 4,743,831 | 5/1988 | Young | 340/636 |

FOREIGN PATENT DOCUMENTS

| | | | |
|---|---|---|---|
| 2922798 | 12/1980 | Fed. Rep. of Germany | 368/9 |
| 0149877 | 11/1980 | Japan | 340/636 |
| 0026375 | 3/1981 | Japan | 320/48 |
| 0186872 | 8/1986 | Japan | 324/427 |
| 0240877 | 10/1987 | Japan | 340/636 |

OTHER PUBLICATIONS

"Available Battery Time Sensor", *IBM Tech. Discl. Bultn*; Ferraiolo & Gass, vol. 16, #5, (Oct., 73).

*Primary Examiner*—Thomas H. Tarcza
*Assistant Examiner*—Linda J. Wallace
*Attorney, Agent, or Firm*—Michael J. Zelenka; Roy E. Gordon

[57] ABSTRACT

A method of indicating the state of charge of a battery is provided wherein a LED clock electrically connected to the battery operates each time current passes through the battery and stops when there is no battery current; the clock retaining the amount of time already passed so that resumed battery operation again activates the clock to continue counting.

5 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD OF INDICATING THE STATE OF CHANGE OF A BATTERY USING A LIGHT EMITTING DIODE (LED) CLOCK CONNECTED TO THE BATTERY

The invention described herein may be manufactured, used, and licensed by or for the Government for governmental purposes without the payment to me of any royalty thereon.

This invention relates in general to a method of indicating the state of charge of a battery and in particular, to a method of quickly, easily, and inexpensively indicating the state of charge of a battery that shows a constant open circuit and/or load potential until the battery is nearly used up.

BACKGROUND OF THE INVENTION

The increasing usage of batteries showing a constant open circuit and/or load potential until the battery is nearly used up as for example, lithium or calcium batteries, especially for military use, has resulted in the increased procurement of these batteries at significant cost. Battery packs may contain a string of 5 to 10 "D-type" cells connected in series along with safety features such as current fuses, thermal fuses and diodes to prevent recharging. One characteristic of a lithium battery is a fairly constant voltage under constant current load until near the very end of discharge, when voltage drops very rapidly. A consequence of this is that it is not possible to measure open circuit voltage or load voltage to determine whether the battery is unused, 25 percent, 50 percent, or 75 percent discharged of its nominal capacity. Thus, when a battery will need replacing is indeterminate. Consequently, when in doubt about the state of a battery, the user will usually throw the old battery away and replace it with a new battery. Many usable batteries are needlessly being thrown away at a significant cost to the user. Fully utilizing batteries for training purposes is most cost effective and desirable. In combat situations, any doubt about the battery rightfully requires its replacement. Development of a method of indicating the state of charge of a battery could allow the complete discharge of batteries used for training and provide confidence in a combat situation since the user will know that the battery is "good" or that replacement is prudent.

SUMMARY OF THE INVENTION

The general object of this invention is to provide a simple and economic method of determining the state of charge of a battery. A more particular object of the invention is to provide such a method where the battery is one that shows a constant open circuit and/or load potential until the battery is nearly used up. A particular object of the invention is to provide such a method for a lithium battery.

It has now been found that the aforementioned objects can be attained by electrically connecting a Light Emitting Diode (LED) clock to the battery so that the clock operates each time current passes through the battery and stops when there is no battery current, the clock retaining the amount of time already passed so that resumed battery operation again activates the clock to continue counting, and directly reading the amount of battery usage from the clock.

The method uses the operation of a LED clock, which is very inexpensive and can run off a tiny fraction of current supplied by the battery itself. Operation of the clock occurs each time current passes through the battery pack, that is, during battery usage only. The LED clock initially shows a time of 0:00. The amount or time of battery usage is directly read. For example, 2:15 indicates 2 hours, 15 minutes of total battery usage. When there is no battery current, the clock stops counting but remembers or retains the amount of time already passed. Resumed battery operation again activates the clock to continue counting.

For a particular battery and piece of equipment, one knows the expected battery capacity or lifetime and therefore is able to gauge when replacement is necessary. For example, a radio set with a particular battery may operate for seven hours. For training, you can use virtually 100 percent of the battery capacity. In combat, you can be assured of its status in order to make critical judgments as to its suitability for the mission.

The attractiveness of the method of this invention is that it is simple, inexpensive, easy to install, and does not require an additional power source. Furthermore, there is no additional equipment to carry, maintain, calibrate, replace or learn how to operate.

The method of the invention is exemplified by referring to the drawing.

DESCRIPTION OF THE DRAWING

Referring to FIG. 1 and FIG. 2, the LED clock is located near the pin connector to be readily accessible. The LED clock is electrically connected to the string of cells to provide constant electrical power for memory. The LED clock is also connected across a shunt at the pin connector causing the LED clock to operate when current is being drawn from the battery.

Figure 1:
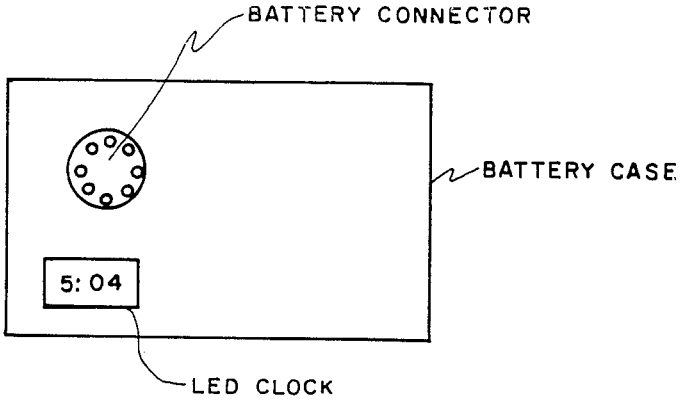
FIG. 1 is a top view of a Battery Case including an LED clock and an external pin connector.
Figure 2:
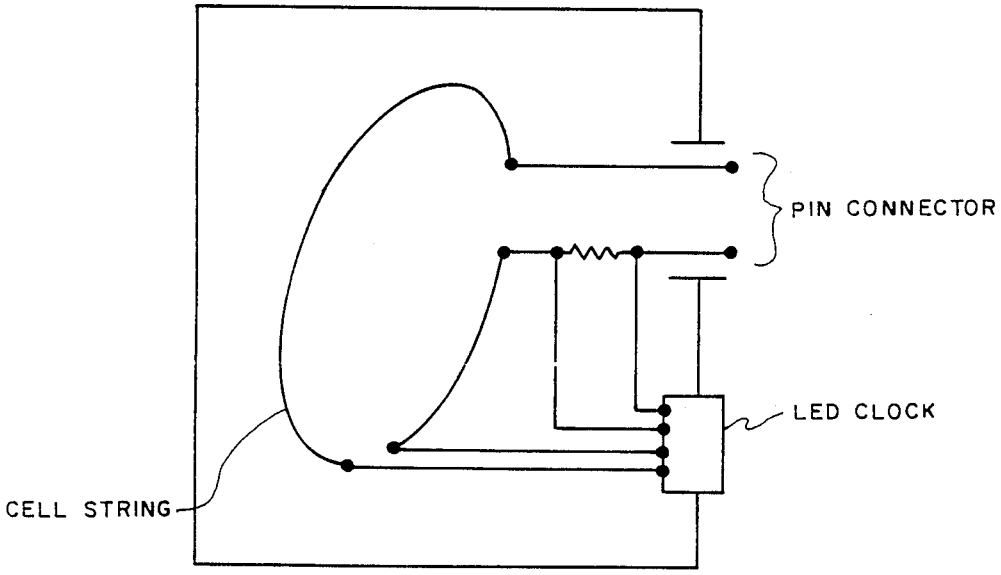
FIG. 2 is an internal view of the external pin connector and LED clock electrically connected to a string of cells connected in series that make up the battery.

When no current passes through the pin connector, the LED clock is operated by only as much current as is required for memory.

I wish it to be understood that I do not desire to be limited to the exact details of construction as described for obvious modifications will occur to a person skilled in the art.

What is claimed is:

1. A method of quickly, easily, and inexpensively indicating the state of charge of a battery comprising electrically connecting an LED clock to the battery so that the clock operates each time current passes through the battery and stops when there is no battery current, the clock retaining the amount of time already passed so that resumed battery operation again activates the clock to continue counting, and directly reading the amount of battery usage from the clock.

2. Method according to claim 1 wherein the battery is a lithium battery.

3. Method according to claim 1 wherein the battery is a calcium battery.

4. Method according to claim 1 wherein a shunt is provided to supply power to operate the "clock" only when current is being drawn from the battery.

5. Method according to claim 1 wherein the LED clock is provided with just enough current to maintain memory continuously.

* * * * *